United States Patent [19]

Kühne et al.

[11] Patent Number: 4,597,983

[45] Date of Patent: Jul. 1, 1986

[54] METHOD FOR PRODUCING A DIRECTED AEROSOL STREAM

[75] Inventors: Reinhart Kühne; Max Kuisl, both of Ulm, Fed. Rep. of Germany

[73] Assignee: Licentia Patent-Verwaltungs-GmbH, Frankfurt am Main, Fed. Rep. of Germany

[21] Appl. No.: 632,291

[22] Filed: Jul. 19, 1984

[30] Foreign Application Priority Data

Jul. 20, 1983 [DE] Fed. Rep. of Germany ....... 3326043

[51] Int. Cl.$^4$ .............................................. B05D 1/06
[52] U.S. Cl. ...................................... 427/27; 65/3.11; 65/3.12; 65/3.20; 427/162; 427/163; 427/166; 427/167; 427/168
[58] Field of Search ................. 427/27, 162, 163, 166, 427/167, 168; 65/3.12, 3.2, 3.11

[56] References Cited

U.S. PATENT DOCUMENTS

| | | | |
|---|---|---|---|
| 4,083,708 | 4/1978 | Heath et al. | 65/3.2 X |
| 4,090,055 | 5/1978 | King | 65/3.2 |
| 4,224,046 | 9/1980 | Izawa et al. | 65/3 A |
| 4,233,045 | 11/1980 | Sarkar | 65/3.12 |
| 4,378,987 | 5/1983 | Miller et al. | 65/3.12 |
| 4,440,558 | 4/1984 | Nath et al. | 65/3.12 |

Primary Examiner—Thurman K. Page
Attorney, Agent, or Firm—Spencer & Frank

[57] ABSTRACT

The present invention relates to a method for producing a directed aerosol stream by a flame free reaction which is conducted while enveloped within an aerosol free gas and/or vapor stream. It is particularly suitable for use in coating systems, as it permits economical coating without so-called wall deposits.

20 Claims, 1 Drawing Figure

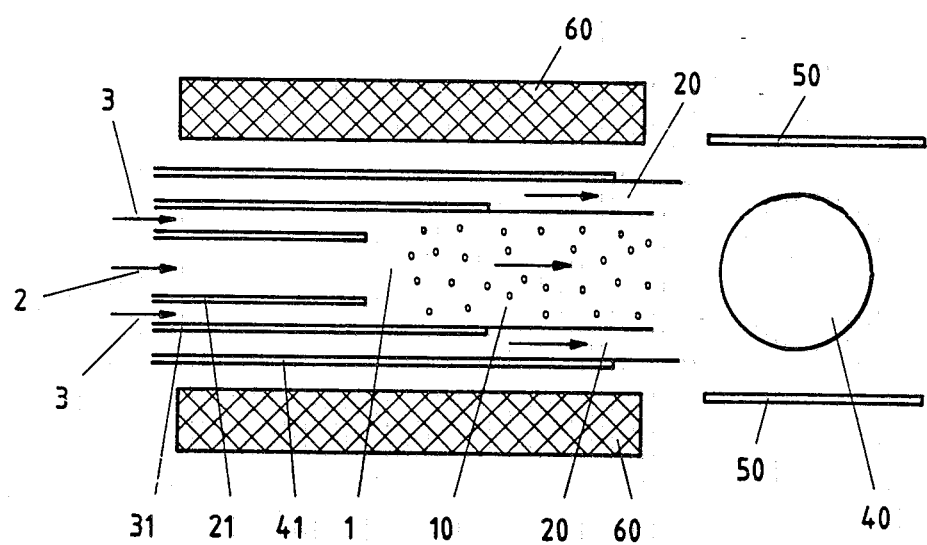

METHOD FOR PRODUCING A DIRECTED AEROSOL STREAM

The present invention relates to a method for producing an aerosol stream wherein the aerosol is produced by a flame free reaction of a mixture of gases or vapors, or both.

The invention relates, in particular, to a directed aerosol which contains solid particles as well as at least one gas and/or vapor. This invention also relates to the use of such an aerosol stream.

BACKGROUND OF THE INVENTION

Aerosols containing solid particles may be referred to as fumes and aerosols containing gases or vapors as well as liquid particles are also called fogs. An exemplary process for producing a flowing aerosol, hereinafter called and aerosol stream, provides that gaseous and/or vaporous chemical components are mixed with the aid of a diffusion process and/or a turbulent mixing process and the resulting gas and/or vapor mixture is converted by thermal reaction, e.g. flame hydrolysis, into an aerosol stream.

In an aerosol stream, the solid or liquid particles move at various angles and in various directions. An aerosol stream of this sort is often uneconomical to use when a directed stream is needed, e.g., in manufacturing facilities which do coating, where only the articles to be coated with the particles are to be covered and not their surroundings. It is obvious to direct such an aerosol stream by mechanical means, e.g., using baffles. However, this procedure is uneconomical, since the baffles are also coated by the aerosol particles, resulting in losses of the aerosol and requiring expensive cleaning procedures.

SUMMARY OF THE INVENTION

It is the object of the present invention to provide an improved process for producing a directed aerosol stream in such a way that an economically manageable aerosol stream is produced which has the highest possible particle density and which is suitable, in particular, for coating or precipitation systems.

This object is accomplished by producing an aerosol stream by a flame free chemical reaction in a gas and/or vapor mixture and conducting the stream enveloped in an essentially aerosol free gas and/or vapor stream.

BRIEF DESCRIPTION OF THE DRAWING

FIG. 1 is a sectional side view of an aerosol generator according to the invention.

DETAILED DESCRIPTION OF THE EMBODIMENTS

The present invention will now be described in greater detail with the aid of an embodiment and with reference to the schematic drawing of FIG. 1.

FIG. 1 illustrates an aerosol generator according to the invention, which is essentially comprised of concentrically arranged pipes or conduits 21, 31, and 41, each having a cross section which is adapted to the intended use of the generated aerosol stream. For example, the cross section of the conduits may be selected to be circular or rectangular. The inner conduits 21 and 31 initially conduct gaseous and/or vaporous components in laminarly flowing streams symbolized by arrows 2 and 3, into a reaction chamber 1. In chamber 1 diffusion produces a gas and/or vapor mixture which is converted by chemical reaction to an aerosol, the aerosol stream 10. This chemical reaction may be initiated, for example, by the heat generated in a furnace 60 arranged around reaction chamber 1. The resulting, essentially laminar flow aerosol stream 10 is now conducted within an envelope of an aerosol particle free gas and/or vapor stream 20, which is introduced to surround the aerosol stream 10 through the outer concentric conduit 41. The gas and/or vapor stream 20 in essentially laminar flow prevents radial movement of the particles contained in the aerosol stream 10. This makes it possible, particularly in coating systems, to shape the cross section of aerosol stream 10 by way of nozzles to precisely direct the aerosol stream and to make the coating processes economical. The particle free gas and/or vapor stream 20, in particular, prevents clogging of the nozzles, the walls of the reaction chamber and some eventually necessary baffles by preventing the aerosol from contacting the appropriate surfaces and thus avoids costly cleaning work. The shape of the nozzle is calculated and/or experimentally determined according to the body that is to be coated. E.g. for the manufacturing of so called preforms for optical fibers it is necessary to coat the outer surface of a barlike body with several glassy layers. In that case the end of the outer concentric conduit 41 has a nozzle that is part of a tube with a rectangular cross-sectional area. This cross-sectional area has the same length and the same width as the barlike body.

FIG. 1 also shows a body 40 to be coated which is surrounded by aerodynamic guide elements 50 in such a manner that almost all particles contained in aerosol stream 10 impinge on body 40 and in this manner permit economical coating.

To enhance the rate of precipitation and reduce waste, it is possible to generate an electrical field between body 40 and guide elements 50 by which the particles contained in aerosol stream 10 are guided onto body 40. If these particles are of a dielectric nature, e.g., glass, it is possible to form the electrical field in such a manner that electrical dipoles are produced in the particles which enhance the coating of body 40. Such dipoles avoid electrostatic charges in body 40 that would make further coating difficult. The electric field is generated by a commercially available high-tension direct-current-generator which can produce an electric field of about 20 kV/cm between the guide elements 50 and the body 40. The body 40 is connected to either poles (positive or negative) of the generator whereas the other pole and the guide elements 50 are grounded. In this way an inhomogeneous electrical field is generated which polarises the particles of the aerosol stream. In such a field the polarised particles are attracted by the body 40.

EXAMPLE I

Body 40 is formed as a rod or pipe-shaped tube carrier body whose outer jacket surface is to be coated with a vitreous and/or glass forming coating in such a manner that a so-called preform results from which light waveguides, i.e., optical fibers, can be drawn. This drawing process is state of the art and consists of the following steps. The glassy and tubelike preform has a length of about 1 m and an outer diameter of about 10 cm. The thickness of the wall of the tube and the refractive index are chosen according to the optical fiber to be drawn, e.g. a graded index fiber with an outer diameter of about 125 μm. The preform is heated at one end in a way that it collapses and a fiber could be drawn out of this end.

In this example, body 40 is rotated about its longitudinal axis and conduits 21, 31, and 41 have rectangular cross sections so that simultaneous coating along a circumferential line of body 40 is possible. The constituents symbolically represented by arrows 2 and 3 comprise silicon tetrachloride (SiCl$_4$) and water vapor (H$_2$O), respectively, which are converted in reaction chamber 1 under the influence of heat to a silicon dioxide (SiO$_2$) containing aerosol stream according to the following formula:

$$SiCl_4 + 2H_2O \rightarrow SiO_2 + 4HCl$$

This aerosol stream is guided within a gas and/or vapor stream 20 containing an inert gas, e.g. N$_2$. By adding doping substances, e.g., germanium tetrachloride (GeCl$_4$), to the gaseous silicon tetrachloride, it is possible to precipitate doped glass layers onto the carrier body. The respective flow rates within conduits 21, 31, and 41 are selected in such a manner that, on the one hand, a laminar flow is maintained but, on the other hand, rediffusion from reaction chamber 1 into the conduits is avoided. This prevents undesirable particle deposition in conduits 21, 31, and 41. For example this is acheived under the following conditions. To produce the aerosol stream 10 a gaseous mixture is led to the reaction chamber with a cross-sectional area of 120 cm$^2$ which is heated to about 800° C. The gaseous mixture contains nitrogen (N$_2$) as a carrier gas at a flow rate of about 240 liter/h, gaseous SiCl$_4$ at a flow rate of about 100 liter/h, water vapour at a flow rate of about 200 liter/h and gaseous GeCl$_4$ as doping material at a flow rate of up to 10 liter/h. The flow rate of GeCl$_4$ is altered to produce the desired index-profile of the optical fiber. The gas and/or vapor stream 20 consists of gaseous N$_2$ at a flow rate of about 90 liter/h. In the reaction chamber 1 there is a resulting velocity of flow of about 1 cm/sec. The mentioned chemical reaction produces Ge-doped or undoped SiO$_2$-particles with a diameter of about 0.2 μm and a density of about $5 \times 10^{10}$ particles/cm$^3$. In the reaction chamber 1 the mixture of gaseous GeCl$_4$ and gaseous SiCl$_4$ reacts to homogeneously doped particles. The reaction of GeCl$_4$ + 2H$_2$O → GeO$_2$ + 4HCl is analogous to that of SiCl$_4$ with H$_2$O. Therefore the desired relation of GeO$_2$ to SiO$_2$ in the preform is exactly related to the adjustable relation of gaseous GeCl$_4$ to gaseous SiCl$_4$. For optical fibers it is necessary to rotate the body 40 around its axis to acheive glassy layers of homogeneous thickness. If this rotation is not done continuously one obtains a layer with an alternating thickness, e.g. with an elliptical cross-sectional shape. The resulting optical fiber can be used for transmitting polarized light without altering the kind of polarisation.

If the body 40 has another form, e.g. a disk or ball like form, the dimensions of the reaction chamber, the nozzle and the gasflows have to be changed respectively.

The invention is not limited to the described embodiment but can likewise be employed in a similar manner for other purposes, e.g., to coat silicon wafers.

The embodiments described herein are provided for the purpose of illustrating the invention, which is intended to include all embodiments, variations, equivalents and modifications within the scope of the claims that follow.

We claim:

1. A method for producing a directed aerosol stream from gaseous and/or vapor phase reactants, comprising;
   conveying gaseous and/or vapor phase reactants to a reaction site in a reaction chamber;
   reacting the reactants at the reaction site in a flame free chemical reaction to produce an aerosol composition;
   allowing the aerosol composition to pass from the reaction site; and immediately surrounding the aerosol composition with a moving, essentially aerosol free, gas and/or vapor stream; wherein the reactants and the aerosol free gas and/or vapor stream and conveyed to the reaction site through essentially concentrically arranged conduits and the aerosol free gas and/or vapor stream is conveyed through the outermost of the concentrically arranged conduits; whereby a directed aerosol stream enveloped in an aerosol free gas and/or vapor stream is formed.

2. The method for producing a directed aerosol stream as defined in claim 1, wherein the reactants being conveyed to the reaction site, the moving essentially aerosol free gas and/or vapor stream, and the directed aerosol stream enveloped in the aerosol free gas and/or vapor stream are all maintained in essentially laminar flow.

3. The method for producing a directed aerosol stream as defined in claim 1, wherein the gas and/or vapor reactants form a reaction mixture by mutual diffusion of the reactants.

4. The method for producing a directed aerosol stream as defined in claim 1, wherein the essentially aerosol stream gas and/or vapor stream consists essentially of an inert gas.

5. A method for producing a directed aerosol stream as defined in claim 4, wherein at least one of the conduits has a nozzle at its end closest to the reaction site which prevents the formation of turbulence in the aerosol stream.

6. A method for producing a directed aerosol stream as defined in claim 1, wherein the reaction chamber is a furnace and the aerosol comprises solid SiO$_2$ particles.

7. Method for producing a directed aerosol stream as defined in claim 6, wherein the aerosol produced comprises solid SiO$_2$ particles produced by the reaction of SiCl$_4$ with water vapor.

8. The method for producing a directed aerosol stream as defined in claim 1, wherein a body is disposed within the path of the directed aerosol stream downstream from the reaction chamber, and the particles within the aerosol stream are deposited onto said body.

9. The method for producing a direced aerosol stream as defined in claim 8, wherein at least one aerodynamic guide element is disposed within the region of said body so as to shape the aerosol stream, whereby the directed aerosol stream is directed onto said body.

10. The method for producing a directed aerosol stream as defined in claim 9, wherein an electrical field is generated between said body and the guide element, thereby enhancing the deposition of the particles in said aerosol stream onto said body.

11. The method for producing a directed aerosol stream defined in claim 10, wherein the aerosol stream comprises dielectric particles which become electrically polarized particles in the electrical field, thereby further enhancing the deposition of the particles onto said body.

12. The method for producing a directed aerosol stream as defined in claim 8, wherein the body employed is at least one circular cylindrical supporting body onto which a coating of particles is deposited, thereby producing a preform for the production of an optical waveguide.

13. The method for producing a directed aerosol stream as defined in claim 12, wherein the cylindrical supporting body is coated essentially simultaneously along at least one circumferential line.

14. The method for producing a directed aerosol stream as defined in claim 8, wherein the aerosol stream comprises $SiO_2$ particles.

15. The method for producing a directed aerosol stream as defined in claim 14, wherein the aerosol stream comprises $SiO_2$ particles and doping substances.

16. The method for producing a directed aerosol stream as defined in claim 15, wherein the doping substances comprise $GeCl_4$.

17. The method for producing a directed aerosol stream as defined in claim 8, wherein the body disposed within the path of the directed aerosol stream is a silicon wafer.

18. The method for producing a directed aerosol stream as defined in claim 13, wherein the reaction chamber is a furnace, the aerosol stream comprises $SiO_2$ particles produced by the reaction of $SiCl_4$ with water vapor, and the essentially concentrically arranged conduits end in nozzles which shape the cross-section of the aerosol stream to the cross-section of the cylindrical supporting body.

19. The method for producing a directed aerosol stream as defined in claim 18, wherein at least one aerodynamic guide element is disposed within the region of said body to shape the aerosol stream, whereby the directed aerosol stream is directed onto said body.

20. The method for producing a directed aerosol stream as defined in claim 19, wherein an electrical field is generated between said body and the guide element, thereby enhancing the deposition of the particles in said aerosol stream onto said body.

* * * * *